(12) United States Patent
Patel et al.

(10) Patent No.: US 8,816,742 B2
(45) Date of Patent: Aug. 26, 2014

(54) ADAPTIVE MEMORY CALIBRATION USING BINS

(75) Inventors: Jagrut Viliskumar Patel, San Diego, CA (US); Gregory Bullard, La Mesa, CA (US); Sanat Kapoor, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1421 days.

(21) Appl. No.: 11/267,627

(22) Filed: Nov. 4, 2005

(65) Prior Publication Data

US 2008/0123444 A1  May 29, 2008

Related U.S. Application Data

(60) Provisional application No. 60/625,229, filed on Nov. 5, 2004.

(51) Int. Cl.
*H03H 11/06* (2006.01)

(52) U.S. Cl.
USPC .......................................... 327/261; 327/276

(58) Field of Classification Search
USPC .......................... 327/291, 293, 294, 261, 276
See application file for complete search history.

(56) References Cited

U.S. PATENT DOCUMENTS

| | | | |
|---|---|---|---|
| 5,357,195 A | 10/1994 | Gasbarro et al. | |
| 5,920,216 A * | 7/1999 | Fischer | 327/158 |
| 6,175,928 B1 * | 1/2001 | Liu et al. | 713/401 |
| 6,204,694 B1 * | 3/2001 | Sunter et al. | 326/93 |
| 6,456,560 B2 | 9/2002 | Arimoto et al. | |
| 6,564,335 B1 * | 5/2003 | Freker | 713/600 |
| 6,754,869 B2 | 6/2004 | Bucksch et al. | |
| 6,850,107 B2 * | 2/2005 | Gomm | 327/277 |
| 7,290,186 B1 | 10/2007 | Zorian et al. | |
| 7,646,835 B1 * | 1/2010 | Rozas | 375/354 |
| 2001/0017814 A1 * | 8/2001 | Arimoto et al. | 365/233 |

FOREIGN PATENT DOCUMENTS

| | | |
|---|---|---|
| JP | 7134701 | 5/1995 |
| JP | 2000235517 | 8/2000 |
| JP | 2001154907 | 6/2001 |
| SU | 1471156 | 4/1989 |
| SU | 1529220 | 12/1989 |

OTHER PUBLICATIONS

International Search Report—PCT/US2005/040363, International Search Authority—European Patent Office—Mar. 23, 2006.
Written Opinion—PCT/US2005/040363, International Search Authority—European Patent Office—Mar. 23, 2006.

* cited by examiner

*Primary Examiner* — Hai L Nguyen
(74) *Attorney, Agent, or Firm* — Peter Michael Kamarchik; Nicholas J. Pauley; Joseph Agusta

(57) ABSTRACT

An electronic device comprises an electronic component and an integrated circuit, wherein the integrated circuit is configured to generate a system clock and an external clock having a programmable delay from the system clock, provide the external clock to the electronic component, determine a delay range between system clock and the external clock in which the integrated circuit and the electronic component can communicate, and program the external clock with one of a plurality of predetermined delay values based on the delay range.

19 Claims, 8 Drawing Sheets

ADAPTIVE MEMORY CALIBRATION USING BINS

CLAIM OF PRIORITY UNDER 35 U.S.C. §119

The present application for patent claims priority to Provisional Application No. 60/625,229 entitled "Adaptive Memory Calibration Using Bins" filed Nov. 5, 2004, and assigned to the assignee hereof and hereby expressly incorporated by reference herein.

BACKGROUND

1. Field

The present disclosure relates to systems and techniques for calibrating an integrated circuit to an electronic component.

2. Background

Integrated circuits have revolutionized the electronics industry by enabling new applications which were not possible with discrete devices. Integration allows complex circuits consisting of millions of electronic components to be packaged into a single chip of semiconductor material. In addition, integration offers the advantages of fabricating hundreds of chips on a single silicon wafer, which greatly reduces the cost and increases the reliability of each of the finished circuits.

Integrated circuits are widely used today in electronic devices to implement sophisticated circuitry such as general purpose and specific application processors. A controller integrated onto the chip may be used to interface the various processors with off-chip components, such as external memory and the like. Clocks generated by the controller may be used to access these off-chip components. These clocks should operate at a specific nominal speed, within a certain allowed tolerance, to ensure that the controller can communicate with the off-chip components under worst case temperature and voltage conditions.

Due to processes inherent in the silicon wafer fabrication process, a set of chips generated from a single wafer may fall into a range of different process speed ratings. Depending on the application, some manufacturers are forced to discard slow chips and fast chips that are outside of the nominal tolerance range. This leads to large amounts of waste, which can be very costly.

In an attempt to preserve those portions of the wafer that do not produce nominal chips, some manufacturers engage in a method of speed binning, in which the various chips produced from a single wafer are tested and batched according to their graded process speed. This method of batching chips according to their speed is time consuming and costly. Further cost is incurred as a result of selling slow chips and fast chips at reduced prices.

Delays are used to implement the timing needed to ensure error-free communication between the integrated circuit and external component that make up an electronic device. They are a function of many factors, including the speed and voltage of the integrated circuit and the speed of the external component. These delays can be determined, for example, using a calibration process that tests such communications and then derives delays from test results. Variations in such parameters across many integrated circuits and external components can result in a predetermined delay not being optimal for a given electronic device. Yet, it is not practical to know beforehand the actual speed and voltage of each integrated circuit or the speed of the external component. Therefore, at best, chip makers have had to settle for determining a program delay that will work without error across anticipated ranges of such parameters, even though such predetermined delays would knowingly not be optimal for many electronic devices.

SUMMARY

In one aspect of the invention, an electronic device comprises an electronic component and an integrated circuit configured to generate a system clock and an external clock having a programmable delay from the system clock, the integrated circuit being further configured to provide the external clock to the electronic component, determine a delay range between system clock and the external clock in which the integrated circuit and the electronic component can communicate, and program the external clock with one of a plurality of predetermined delay values based on the delay range.

In another aspect of the invention, a method of calibrating an integrated circuit to an electronic component, the integrated circuit having a system clock, comprises generating an external clock on the integrated circuit, the external clock having a programmable delay from the system clock, the method further comprising providing an external clock from the integrated circuit to the electronic component to support communications therewith, determining a delay range between the system clock and the external clock in which the integrated circuit and the electronic component can communicate, and programming the external clock with one of a plurality of predetermined delay values based on the delay range.

In yet another aspect of the invention, an electronic device comprises an electronic component and an integrated circuit, wherein the integrated circuit includes means for generating a system clock, comprising means for generating an external clock on the integrated circuit, the external clock having a programmable delay from the system clock, means for providing an external clock from the integrated circuit to the electronic component to support communications therewith, means for determining a delay range between the system clock and the external clock in which the integrated circuit and the electronic component can communicate, and means for programming the external clock with one of a plurality of predetermined delay values based on the delay range.

In yet another aspect of the invention, a computer readable media embodies a program of instructions executable by a processor to perform a method of calibrating an integrated circuit to an electronic component, the integrated circuit including a system clock and an external clock having a programmable delay from the system clock, the external clock being provided to the electronic component to support communications therewith, the method comprising determining a delay range between the system clock and the external clock in which the integrated circuit and the electronic component can communicate and programming the external clock with one of a plurality of predetermined delay values based on the delay range.

It is understood that other embodiments of the present invention will become readily apparent to those skilled in the art from the following detailed description, wherein various embodiments of the invention are shown and described by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Aspects of the present invention are illustrated by way of example, and not by way of limitation, in the accompanying drawings wherein.

DETAILED DESCRIPTION

The detailed description set forth below in connection with the appended drawings is intended as a description of various embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and devices are shown in block diagram form in order to avoid obscuring the concepts of the present invention. Acronyms and other descriptive terminology may be used merely for convenience and clarity and are not intended to limit the scope of the invention.

In the following detailed description, various aspects of the present invention may be described in the context of an integrated circuit configured to be coupled to an electronic component, such as a storage device. The integrated circuit may be, for example, an Application Specific Integrated Circuit (ASIC) comprising at least one processor. The storage device may, for example, be a Synchronous Dynamic Random Access Memory (SDRAM) or similar device. While these inventive aspects may be well suited for use with these components, those skilled in the art will readily appreciate that these inventive aspects are likewise applicable for use in various other electronic devices. Accordingly, any reference to a specific type of integrated circuit or electronic component (e.g., external or off-chip memory) is intended only to illustrate the inventive aspects, with the understanding that such inventive aspects have a wide range of applications.

Figure 1:
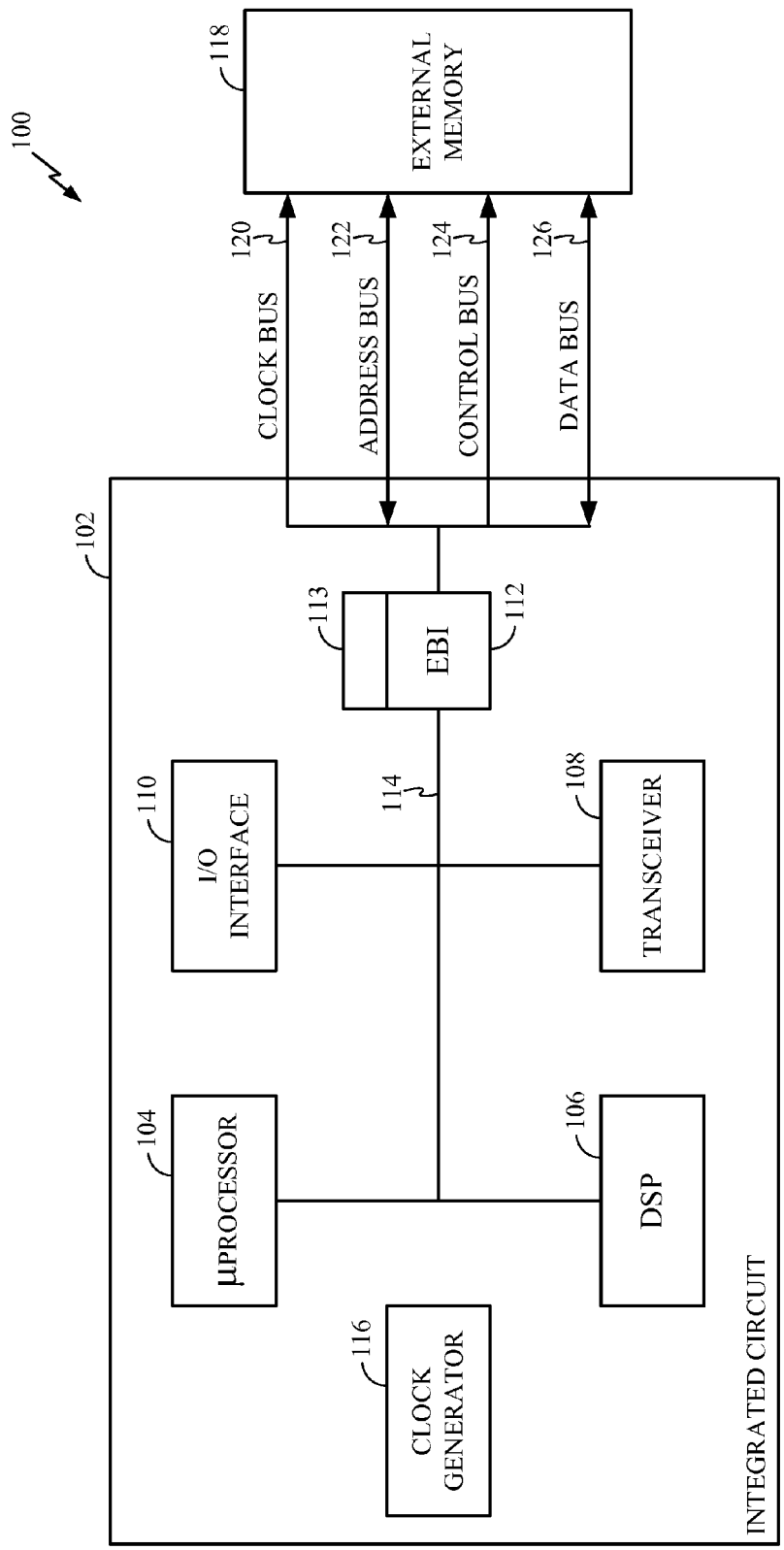
FIG. 1 is a conceptual block diagram illustrating an example of an electronic device employing an integrated circuit.

FIG. 1 is a conceptual block diagram of an electronic device 100 employing an integrated circuit 102, such as an ASIC. The integrated circuit 102 may include a microprocessor 104, a Digital Signal Processor (DSP) 106, a transceiver 108, an input/output (I/O) interface 110, and an External Bus Interface (EBI) 112. All these components may be coupled together with an Internal System Bus (ISB) 114. A clock generator 116 may be used to generate a system clock signal (or "system clock") for system timing. FIG. 1 should not be construed to require any particular physical layout of the electronic device 100, or the components thereof.

The microprocessor 104 may be used as a platform to run application programs that, among other things, provide user control and overall system management functions for the electronic device 100. The DSP 106 may be implemented with an embedded communications software layer which runs application specific algorithms to reduce the processing demands on the microprocessor 104. Either, or both, of the microprocessor 104 and DSP 106 may also be used to run the algorithms described herein. The transceiver 108 may be used to provide access to an external medium, such as a radio link in the case of a wireless telephone, terminal, e-mail or Web-enabled device, e.g., a Personal Data Assistant (PDA), or other similar device. In some embodiments, the transceiver 108 may provide access to Ethernet, cable modem line, fiber optics, Digital Subscriber Line (DSL), Public Switched Telephone Network (PSTN), or any other communications medium. In other embodiments, the electronics device may be self-contained without a transceiver to support external communications. The I/O interface 110 may be used to support various user interfaces. The user interfaces may include a keypad, mouse, touch screen, audio speaker or head set, microphone, camera and/or the like.

The EBI 112 may be used to provide access between the components on the ISB 114. The EBI 112 may include a controller 113 that provides an interface between the ISB 114 and components external to integrated circuit 102, e.g., one or more off-chip components, such as external component 118. The interface may include a clock bus 120, an address bus 122, a control bus 124, and a data bus 126. Although not shown, the EBI 112 may also provide an interface to a Liquid Crystal Display (LCD) and/or other user interface devices.

In at least one embodiment of an electronic device 100, the external component 118 may be memory, such as a SDRAM. Alternatively, the external component may be a Burst NOR, Burst PSRAM, RAM, ROM, EPROM, EEPROM, VRAM or any other memory component or device, or a memory array. In any of the foregoing cases, the controller 113 may be used to generate an external clock signal (or "external clock") and a feedback clock signal (or "feedback clock") as a function of the system clock from clock generator 116. The external clock may be provided to the external component 118 over the clock bus 120 to read from and write to the external component 118, hereafter SDRAM 118. The feedback clock may be used by the controller 113 to sample data read from the SDRAM 118.

Figure 2:
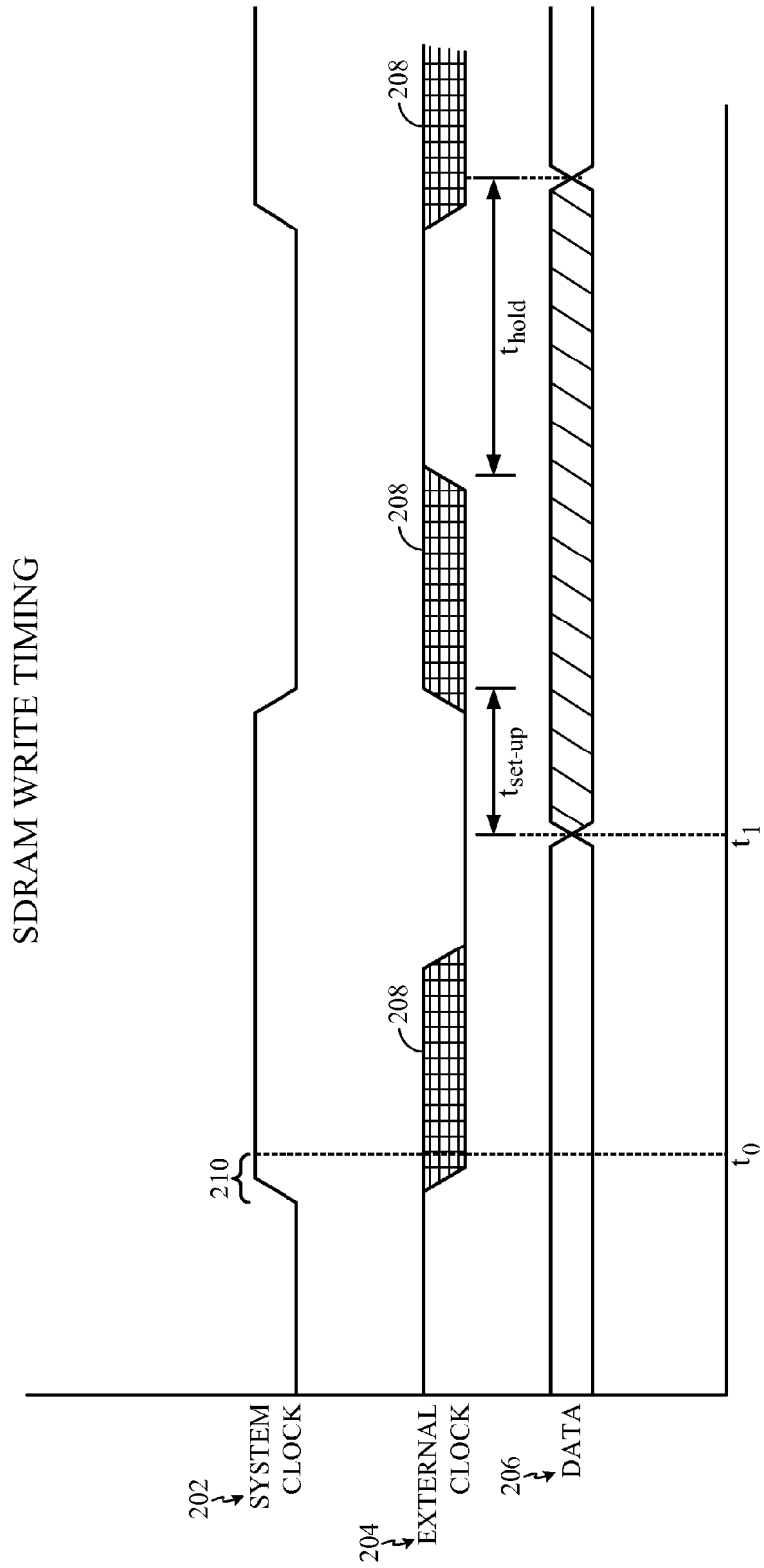
FIG. 2 is a timing diagram illustrating an example of timing parameters to write to off-chip memory.

An example of the timing requirements to write to the SDRAM 118 is shown in FIG. 2. The external clock, which is represented by external clock 204, may be delayed from the system clock, which is represented by system clock 202. Data to be written to the SDRAM 118 is represented by data (or data signal) 206, and may be released onto the data bus 120 (see FIG. 1) from the controller 113 shortly after the transition of the system clock at time t0. The short delay 210 between the transition of the system clock and t0 is due to a propagation delay of the controller 113. The data bus 120 (see FIG. 1) adds additional propagation delay, causing the data 206 to arrive at the input to the SDRAM at time $t_1$. The data at the input to the SDRAM is shown in FIG. 2 with cross-hatching of data 206.

To ensure reliable operation, the data 206 must then be stable at the input to the SDRAM 118 for a brief period of time before the external clock transition. This is called the "minimum set-up time," and is denoted in FIG. 2 as $t_{set\text{-}up}$. There is also a period of time that the data 206 must remain stable following the external clock transition, i.e., after $t_{set\text{-}up}$. This is called the "minimum hold time," and is denoted in FIG. 2 as $t_{hold}$. If the minimum set-up and hold times are not met, then the write operation to the SDRAM cannot be guaranteed. Thus, one can readily see from FIG. 2 that there is a minimum delay requirement between the system clock 202 and the external clock 204 to meet the minimum set-up time, and a maximum delay between the two to meet the minimum hold time. The delay may be programmable, and can be set anywhere between these boundaries, as shown in FIG. 2 by the shaded portion 208 of external clock 204.

Figure 3:
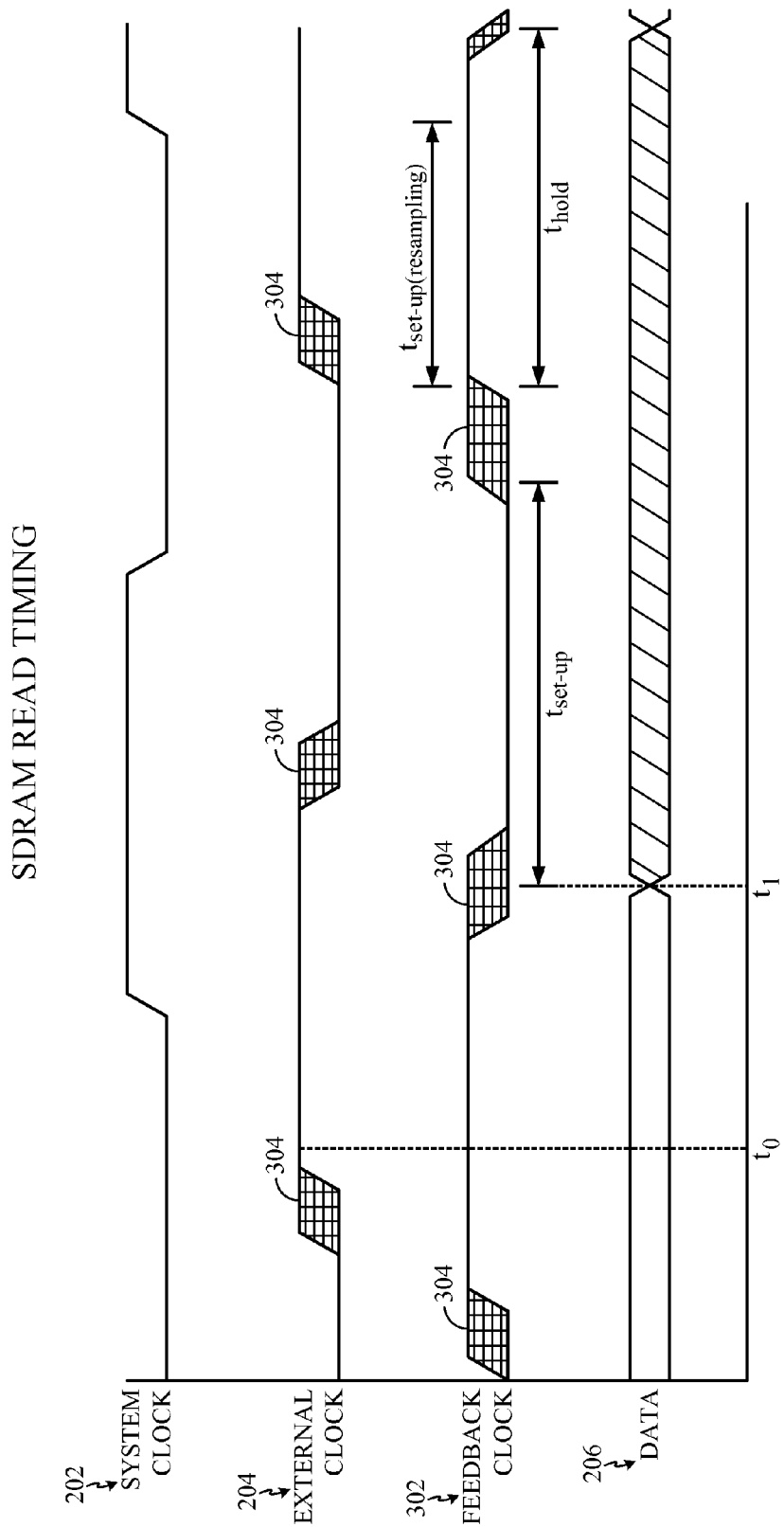
FIG. 3 is a timing diagram illustrating an example of timing parameters to read from off-chip memory.

An example of the timing requirements to read from the SDRAM 118 is shown in FIG. 3. As explained earlier in connection with FIG. 2, the external clock 204 may be delayed from the system clock 202. The feedback clock 302 may also be delayed from the system clock 202 as shown in FIG. 3. The feedback clock 302 may be used to read the data from the SDRAM 118 into the controller 113. Data 206 may be released from the SDRAM 118 onto the data bus 120 (see FIG. 1) shortly after the transition of the external clock 204 at time $t_0$. Due to the propagation delay of the SDRAM 118 and the data bus 120 (see FIG. 1), the data 206 arrives at the input to the controller 113 at time $t_1$. The data at the input to the controller 113 (which is shown with cross-hatching of data 206) must remain stable for a brief period of time before the feedback clock transition. This period of time is defined by the minimum set-up time $t_{set-up}$ of the controller 113. The data 206 must also remain stable following the feedback clock 302 transition for a period of time defined by the minimum hold time $t_{hold}$ of the controller 113. Once the data is read into the controller 113 with the transition of the feedback clock 302, it may be resampled by the system clock. The resampling process has its own requirements including a minimum set-up time in which the sampled data must remain stable before the next transition of the system clock 202. Thus, one can readily see from FIG. 3 that there is a minimum delay requirement between the system clock 202 and the feedback clock 302 to meet the minimum set-up time, and a maximum delay between the two to meet the minimum hold time and resampling set-up times. The delay may be programmable in the controller 113, and can be set anywhere between these boundaries, as shown in FIG. 3 by the shaded portion 304.

Figure 4:
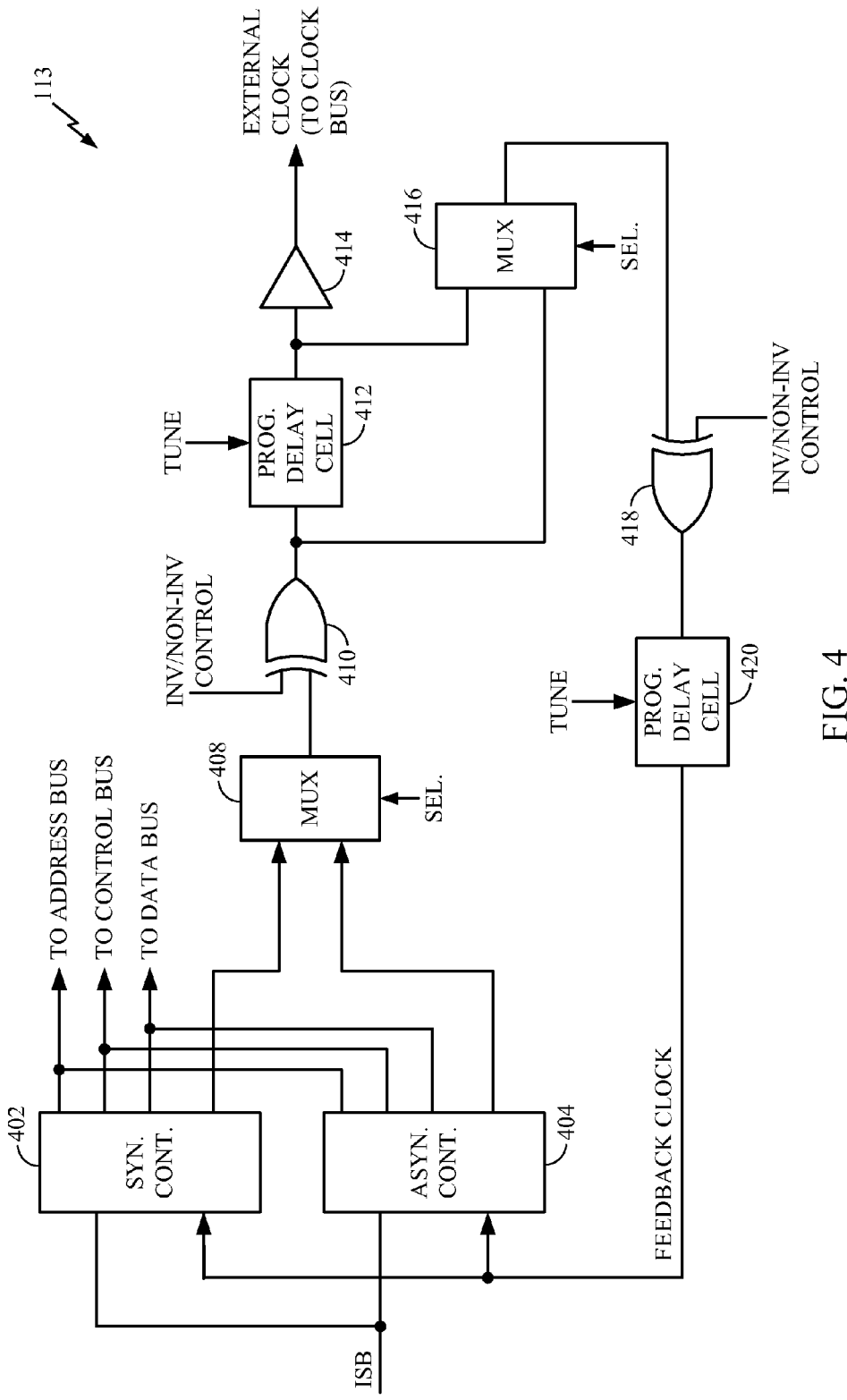
FIG. 4 is a functional block diagram illustrating an example of the operation of a controller.

FIG. 4 is a functional block diagram of an embodiment of a controller 113. In the embodiment shown, the controller 113 may be divided into a synchronous controller 402 and an asynchronous controller 404. This division is merely a design preference and those skilled in the art will readily understand that any configuration may be employed to perform the various functions described throughout this disclosure. The controllers 402 and 404 may be configured to interface the address bus 122, control bus 124, and data bus 126 to the ISB 114 by means well known in the art.

The controller 113 may be used to generate the external clock 204 and feedback clock 302. A multiplexer 408 may be used to select the appropriate system clock 202 depending on whether the data 206 is clocked out of the synchronous or asynchronous controller. In the embodiment shown, the multiplexer 408 may be set to select the system clock used by the synchronous controller 402 to interface to the SDRAM 118. An exclusive OR gate 410 may be used to provide flexibility by providing an inverted or non-inverted system clock 202 to the output. A programmable delay cell 412 may be used to set the delay of the external clock 204. The multiplexer and exclusive OR gate controls, as well as the delay of the external clock, may be programmed by, for example, software running on the microprocessor 104, or by any other means. A bus driver 414 may be used to provide the external clock 204 to the SDRAM 118.

The feedback clock 302 may be generated from either the system clock 202 or the external clock 204. Both clocks may be provided to a multiplexer 416 to provide some versatility to the software programmer. In the described embodiment, the selected system clock may be provided to an exclusive OR gate 418. The exclusive OR gate 418 allows either the inverted or non-inverted clock to be used. A programmable delay cell 420 may be used to delay the feedback clock. The feedback clock 302 may then be fed back to the controllers 402 and 404. The multiplexer and exclusive OR gate controls, as well as the delay of the feedback clock, may be programmed by software running on the microprocessor 104, or by any other means.

As discussed earlier, certain timing constraints imposed by the controller 113 and the SDRAM 118 may limit the possible delay settings for the external and feedback clocks. The delay setting for the external clock, for example, may be constrained by the minimum set-up and hold times for the SDRAM 118. Similarly, the delay setting for the feedback clock may be constrained by the minimum set-up, hold and resampling set-up times for the controller 113. These timing constraints can vary with process, voltage and temperature (PVT).

A calibration algorithm programmed into the integrated circuit may be used to program the delay cells on a per-device basis. This approach may provide optimal clock settings for each individual electronic device. The calibration algorithm may be enabled in the field when the electronic device boots-up, or periodically during its operation. The calibration algorithm may rely in part on statistical information programmed in memory. The statistical information may be derived from a collection of data obtained from testing a sufficient sample of electronic devices at the factory. This process will be referred to as a "characterization process."

The characterization process may begin with the computation of the delay ("K") between the feedback clock and the external clock for a sample of electronic devices. Returning to FIG. 3, one can readily see that the set-up time $t_{set-up}$ for the controller 113 is based on the delay from the transition of the external clock to the transition of the feedback clock, for the read operation. One can also see that the hold time $t_{hold}$ is based on the delay from the transition of the feedback clock to the next transition of the external clock. Accordingly, if the delay between the external clock and the feedback clock is reduced, the set-up time $t_{set-up}$ decreases and the hold time $t_{hold}$ increases. Conversely, if the delay between the external clock and the feedback clock is increased, the set-up time $t_{set-up}$ increases and the hold time $t_{hold}$ decreases. Thus, the initial step of the characterization process may be to compute a delay between the feedback clock and the external clock that satisfies the worst case minimum set-up and hold times of the controller 113 for the sample of electronic devices.

Assuming that the delay between the feedback and external clock device is set to satisfy the minimum set-up and hold times of the controller during the read operation, then the failure or success of a read operation will depend entirely on whether the minimum resampling set-up time $t_{set-up}$ is satisfied. Referring to FIG. 3, the resampling set-up time $t_{set-up}$ is very long when the delay between the system clock and the feedback clock is small. However, as the delay between the two clocks is increased, the resampling set-up time $t_{set-up}$ decreases until it reaches the minimum resampling set-up time $t_{set-up}$. This is the "maximum delay" between the system clock and feedback clock in which the read operation can be guaranteed.

Returning to FIG. 2, the success or failure of a write operation will depend on two timing parameters: the minimum set-up time $t_{set-up}$ and the minimum hold time $t_{hold}$ for writing to the SDRAM 118. As a practical matter, however, the minimum hold time $t_{hold}$ is normally not a limiting factor. This is because the hold time is approximately equal to the clock period less the set-up time $t_{set-up}$, which is much larger than the minimum hold time $t_{hold}$. Accordingly, the minimum set up time $t_{set-up}$ of the SDRAM 118 will determine the "minimum delay" between the system clock and the external clock (or the feedback) in which the write operation can be guaranteed.

During the characterization process, a test procedure may be performed on each electronic device in the sample to determine a range of delay values between the system clock and the feedback clock in which the controller 113 can write to and read from the SDRAM 118. This range is a continuous range bound by a "maximum delay" set by the minimum resampling set-up time $t_{set-up}$ time of the controller 113 and a "minimum delay" set by the minimum set up time $t_{set-up}$ of the SDRAM 118. The testing procedure may involve programming the computed delay between the feedback clock and the external clock into the programmable delay cells of the controller 113 for each of the electronic devices under test. Next, the tuning range of the programmable delay cells for each electronic device may be swept across the entire tuning range, while maintaining the delay between the feedback and external clock. More specifically, for each electronic device, the programmable delay cell 420 for the feedback clock may be set to zero delay and the programmable delay cell 412 for the external clock may be set to K. The delay of the programmable delay cells may then be incrementally increased together. For each incremental delay, the controller 113 reads from and writes to the SDRAM 118, and then classifies each read and write attempt as a failure or success depending on the outcome.

Figure 5A:
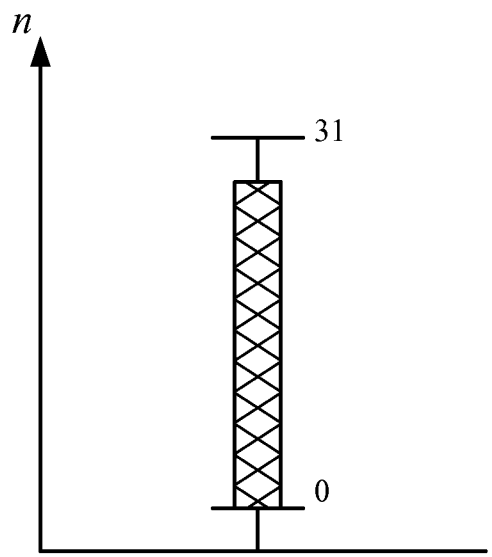
FIG. 5A and FIG. 5B are bar graphs showing representative delay ranges for an integrated circuit at different voltages and speeds.
Figure 5B:
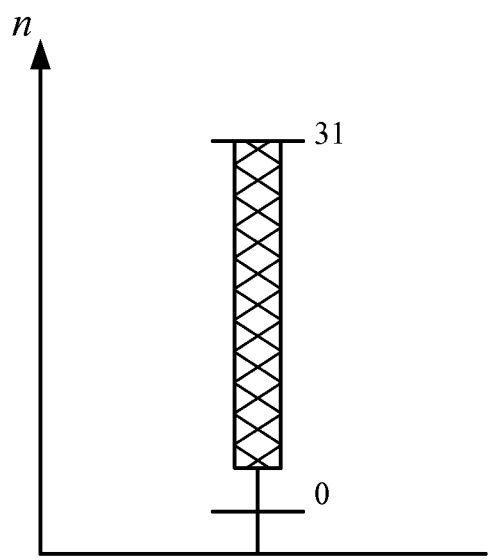

As a practical matter, there may be variations in the speed of specific integrated circuits and in the speed of the SDRAMs that may effect the optimal feedback clock and external clock delays for a specific electronic device. For example, FIGS. 5A and 5B show the test procedure results from two different electronic devices from the sample during the characterization process. In each of FIG. 5A and FIG. 5B, each bar graph represents a range of feedback clock delays for which the respective electronic device may be operated. As is evident, differences in frequency (i.e., clock speed) of the integrated circuit can produce significantly different feedback clock delay requirements. While the external clock delay is shown in each of FIG. 5A and FIG. 5B, the results could have alternatively been presented for the external clock delay, since there is a known relationship between the external clock and the feedback clock in the illustrative embodiment.

Referring to FIG. 5A, the test procedure for an electronic device during the characterization process may be started by setting an optimal voltage for the electronic device. Then, the feedback clock delay is set to zero ($n_{fb}$=0), where $n_{fb}$ is the digital value programmed in the delay cell for the feedback clock, and the external clock delay is set to K ($n_{ext}$=K), where next is the digital value programmed in the delay cell for the external clock. Under these conditions, data is written to the SDRAM and then read from the SDRAM. If the read data is valid, i.e., no error occurred, a "pass" is recorded for the value of n. Otherwise, a "fail" is recorded for the value of n. Then the value of n is incremented, e.g., n=1, while the voltage and frequency remain unchanged. The write, read, and record pass/fail steps are then performed for the new n. This is continued until n=31, which is the maximum value. The results, for example, are shown in bar graph FIG. 5A. The shaded area of the bar graph represents passing values, and extends from about n=1 to about n=28. Failing values fall either below n=1 or above n=28. The "minimum delay" between the system clock and the feedback clock may be referred to as the lowest passing value (LPV) and the "maximum delay" between the system clock and the feedback clock may be referred to as the highest passing value (HPV).

The same test procedure may be performed on a second electronic device at the optimal voltage. In this case, the integrated circuit in the second electronic device is faster than the first. The results are shown in bar graph FIG. 5B. The shaded area of the bar graph represents passing values, and extends from about n=4 to about n=31. Failing values fall either below n=4 or above n=31. Comparing the results of the first and second electronic devices of FIG. 5A and FIG. 5B, it is clear that the various clock delay settings between the system clock and the feedback clock for the second electronic, with the faster integrated circuit, would not work for the first electronic device, with the slower integrated circuit.

The characterization process may be performed over many electronic devices to arrive at a larger population of feedback clock delay solutions. This data may be used to determine a range of delay for values for different classifications of electronic devices. These classifications are referred to as "bins" and based on the speed of the integrated circuit and SDRAM for the electronic devices. Each bin may represent a combination of devices tested. In the illustrative embodiment, four bins are defined that represent combinations of integrated circuit and SDRAM, as follows: (1) slow integrated circuit, fast SDRAM; (2) slow/nominal integrated circuit, slow SDRAM; (3) fast/nominal integrated circuit, fast SDRAM; and (4) fast/nominal integrated circuit, slow SDRAM. Of course, other combinations could be defined, and more or less bins could be defined.

Testing a sufficiently large sample of electronic devices during the characterization process may produce a distribution of delay values for each combination of integrated circuit and SDRAM. From such distributions the bins may be defined. Of course, there are numerous known statistical approaches that could be applied to test data to determine the width of the bins (i.e., a range of delay values between the system clock and the feedback clock). Where insufficient test data is available, extrapolation could be used to estimate bin width and the corresponding delays.

Figure 5C:
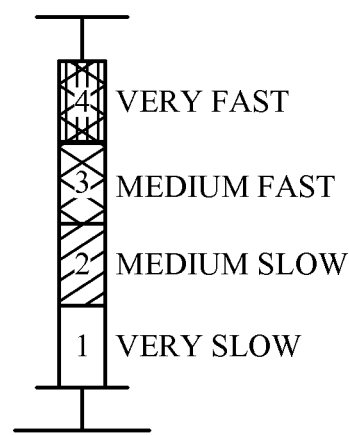
FIG. 5C is a bar graph showing a delay range divided into bins, in accordance with the present invention.

FIG. 5C is a bar graph 550 that shows bins 1, 2, 3, and 4, where each bin has a defined bin width. The width of bin 1 is about 4-8, the width of bin 2 is about 8-12, the width of bin 3 is about 12-16, and the width of bin 4 is about 16-20. Within each bin, a delay setting between the system clock and the feedback clock may be selected. The delay setting may be selected from the center of the bin. By way of example, an electronic device that is characterized as having a slow integrated circuit and fast SDRAM may be relegated to bin 1, and if the delay between the system clock and the feedback clock is set to 6 (i.e., the delay value at the center of bin 1), the electronic device should operate properly. In this case, the delay between the system clock and the external clock would be 6+K. If K is set to 4 to achieve an approximate set-up time of 2 ns and hold time of 1 ns, then the following delay settings can be established for each bin:

Bin 1→Slow integrated circuit, Fast SDRAM: Feedback clock delay=6, External clock delay=10
Bin 2→Slow/Nominal integrated circuit, Slow SDRAM: Feedback clock delay=10, External clock delay=14

Bin 3→Nominal/Fast integrated circuit, Fast SDRAM: Feedback clock delay=14, External clock delay=18

Bin 4→Nominal/Fast integrated circuit, Slow SDRAM: Feedback clock delay=18, External clock delay=22.

The clock settings determined during the characterization process may be used by an adaptive calibration algorithm programmed into the electronic device to set the delay of the feedback and external clocks on a per-device basis in the field. These clock settings and the bin definitions may be stored in memory in the electronic device, or otherwise included with the adaptive calibration algorithm.

Figure 6:
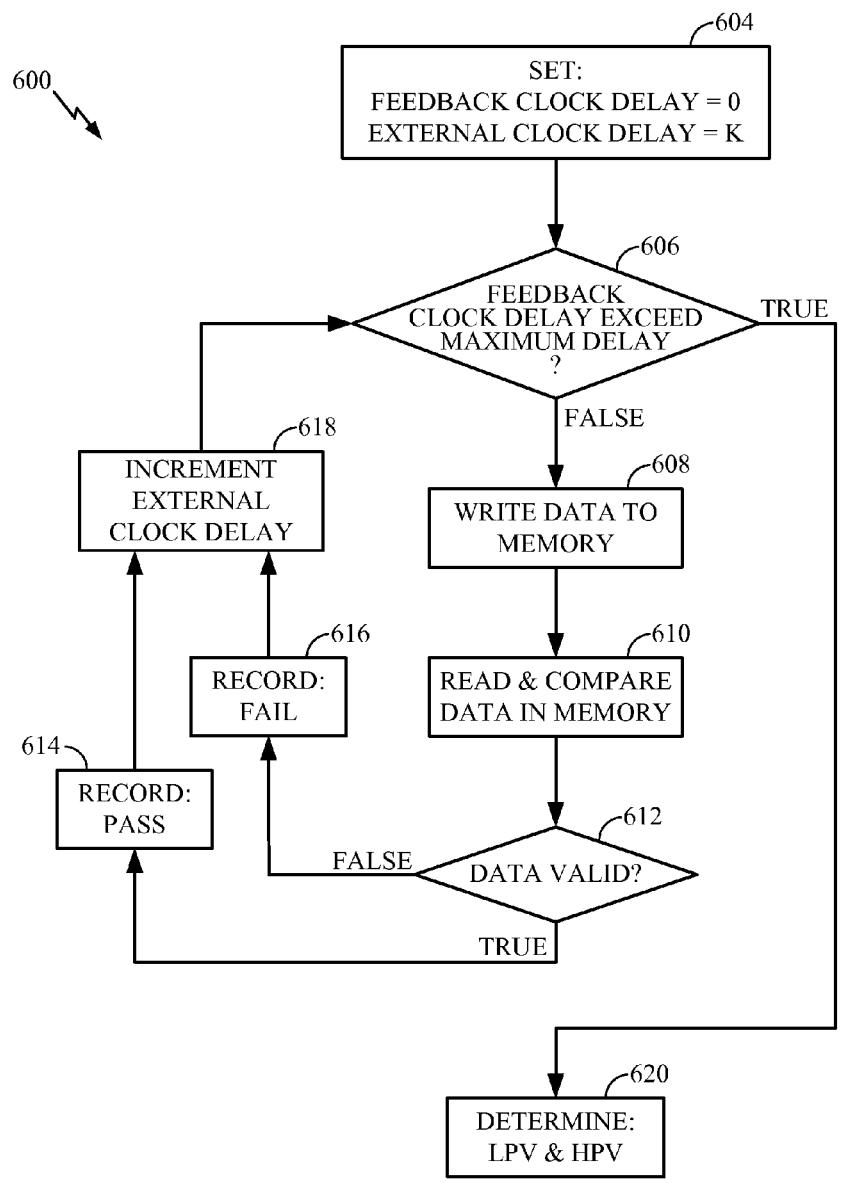
FIG. 6 is a flowchart illustrating an example of a calibration algorithm that may serve as a precursor to the adaptive calibration algorithm of FIG. 7.

FIG. 6 provides a flowchart 600 that depicts an adaptive calibration algorithm used with a specific electronic device—in the field. As with all other algorithms, processes and methods described herein, the adaptive calibration algorithm 700 may be embodied in software, hardware, firmware, or any combination thereof. The adaptive calibration algorithm 600 is similar to that described above for determining the bar graphs of FIGS. 5A and 5B. The adaptive calibration algorithm 600 may be run at the first boot-up of the electronic device 100. The adaptive calibration algorithm 600 may also be run at subsequent boot-ups, randomly, periodically, or in response to a variation to a sensed condition, e.g., voltage, temperature, or speed.

In this example, the adaptive calibration algorithm initially sets the delay between the system clock and the feedback to zero ($n_{fb}$=0), and the delay between the system clock and the external clock to K ($n_{ext}$=K) in step 604. Step 606 tests whether the feedback clock has been swept through the entire tuning range. This may be achieved by determining whether $n_{fb}$ is greater than 31. Assuming the feedback clock delay has not been swept across the entire tuning range, in step 606, the process 600 continues to step 608, where the integrated circuit 102 writes test data to SDRAM 118. The process 600 then continues to step 610, where the integrated circuit 102 reads the test data from SDRAM 118.

The test data that is read is compared to that which was written. If, in step 612, the read data is valid (i.e., correct), then the process 600 continues to step 614 and a "pass" condition is noted for the operation at the feedback and external clock settings. If the read data did not match that which was written, then the test failed and a "fail" condition is recorded for the feedback and external clock settings, in step 616. In either case, the feedback and external clock delay values are then incremented in step 618, and the process 600 returns to step 606. In this manner, the adaptive calibration algorithm 600 sweeps the entire delay range. Once complete, the process 600 continues to step 620, where a resulting LPV and HPV for the electronic device 100 are determined.

Once LPV and HPV are known, the adaptive calibration algorithm 700 may be used to determine the final clock settings. The adaptive calibration algorithm 700 performs tests that are based on known principles of the relationships between the HPV, LPV and speeds of integrated circuits and memory devices—as reflected in the bin definitions discussed above.

In step 702, the LPV and HPV for electronic device 100 are obtained. While the illustrative embodiment determines LPV and HPV using the process of FIG. 6, the adaptive calibration algorithm does not require that the LPV and HPV for electronic device 100 are determined by the process of FIG. 6. It is possible, that LPV and HPV values could be determined in other manners. The LPV and HPV are used to determine which bin is appropriate for the electronic device 100, and therefore which delay setting is appropriate for the electronic device 100. This is accomplished by testing the LPV and HPV against the entire tuning range (i.e., $n_{fb}$ is swept from 0-31).

In step 704, a determination is made of whether the HPV is greater than or equal to 31. If the test in step 704 was false, then the process continues to step 706, where a determination is made of whether or not the LPV is less than or equal to the 0. If LPV is greater than or equal to 0, then the electronic device 100 belongs in bin 1, of step 708. If the LPV is not less than or equal to 0, then the electronic device 100 belongs in bin 2, of step 710. If, in step 704, the HPV was greater than or equal to 31, the algorithm proceeds to step 712, where a determination regarding the LPV is made. If the LPV is less than or equal to 0, then the electronic device 100 belongs in bin 3, of step 714. Otherwise, the electronic device 100 belongs in bin 4, of step 716.

Once the proper bin is determined, the integrated circuit 102 sets the clock delays with the predetermined settings for that bin. In this example, it is the delay setting in the center of the bin. In step 720 the feedback clock delay is obtained, and in step 722 the external clock is determined from the feedback clock delay and the offset K. And in step 724 the programmable external clock delay cell 412 and the programmable feedback clock delay cell 420 are set using the values from step 722.

As is evident, the above algorithms could have been presented as determining the external clock delay, and from the external clock delay determining the feedback clock delay, wherein the feedback clock delay=external clock delay−K. Either approach will suffice, since there is a defined relationship between the feedback clock and external clock given one, the other is obtainable.

Figure 7:
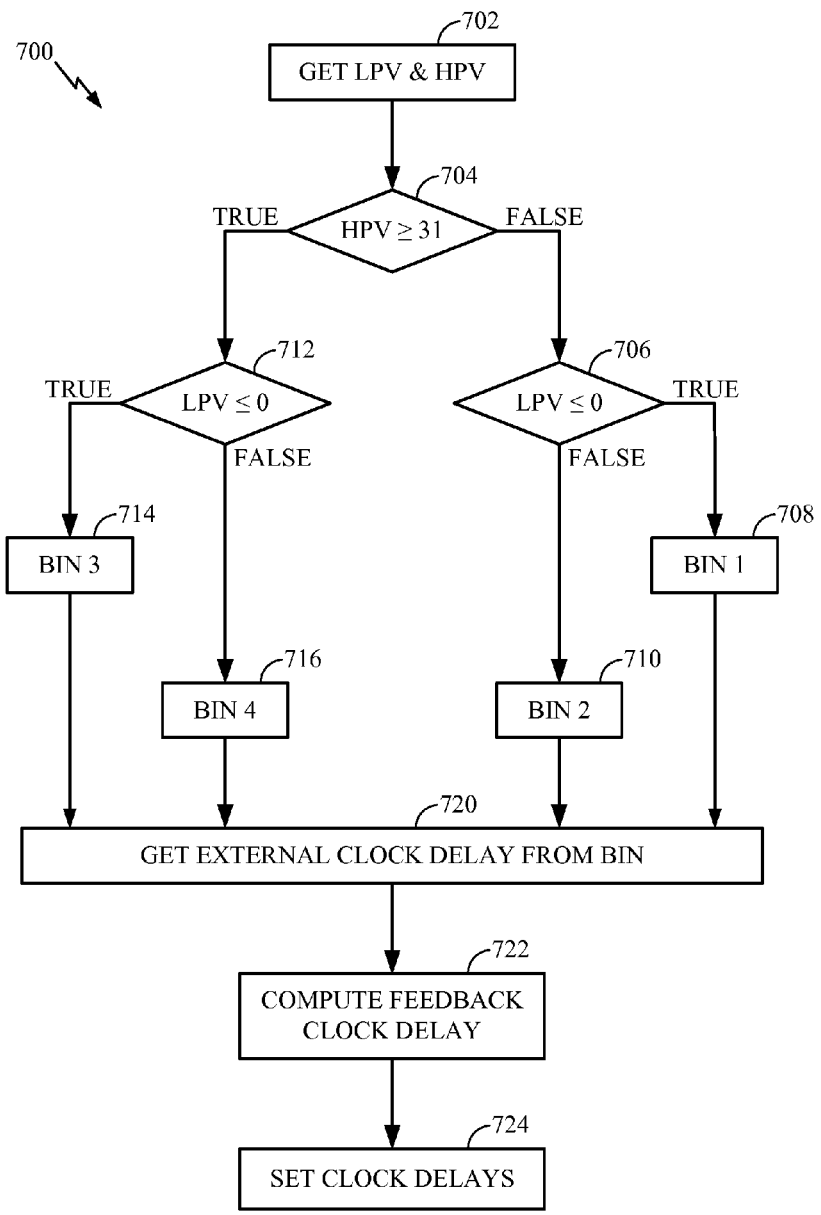
FIG. 7 is a flowchart illustrating an example of an adaptive calibration algorithm, in accordance with the present invention.

Returning to FIG. 7, and using the bin definitions described above with respect to FIG. 5C, if the electronic device 100 falls into bin 1, the feedback clock delay=6 and the external clock delay=10; if the electronic device 100 falls into bin 2, the feedback clock delay=10 and the external clock delay=14; if the electronic device 100 falls into bin 3, the feedback clock delay=14 and the external clock delay=18; and if the electronic device 100 falls into bin 4, the feedback clock delay=18 and the feedback clock delay=22.

As mentioned above, this process could be run, not only at first boot-up, but subsequently as well. For example, the adaptive calibration algorithm could be run at each boot-up, periodically, randomly, or in response to a sensed condition. Such sensed condition could be the sensing of a voltage, temperature, speed of the integrated circuit or external component, or a error in communication between the integrated circuit and external component.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor. The processor and the storage medium may reside in an ASIC.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An electronic device, comprising:
an electronic component; and
an integrated circuit configured to generate a system clock, an external clock having a first programmable delay from the system clock, and a feedback clock having a second programmable delay from the system clock, the integrated circuit being further configured to provide the external clock to the electronic component to write data, to provide the feedback clock to read data from the electronic component, determine a lowest passing value and a highest passing value based upon writing and reading data to and from the electronic component, determine a bin based upon the lowest passing value and the highest passing value, and program the first programmable delay of the external clock with one of a plurality of predetermined delay values based on the bin, wherein the first programmable delay is equal to the second programmable delay plus an offset.

2. The electronic device of claim 1 wherein the integrated circuit is further configured to store the predetermined delay values.

3. The electronic device of claim 1 wherein the electronic component comprises at least one memory device.

4. The electronic device of claim 3 wherein the electronic component comprises at least one of SDRAM, Burst NOR, Burst PSRAM, RAM, ROM, EPROM, EEPROM, or VRAM.

5. The electronic device of claim 1 wherein the lowest passing value and the highest passing value are is related to a range of speeds characterizing the integrated circuit and a range of speeds characterizing the electronic component.

6. The electronic device of claim 1 wherein the electronic device comprises a wireless telephone, personal digital assistant, e-mail device, or Web enabled device.

7. A method of calibrating an integrated circuit to an electronic component, the integrated circuit having a system clock, the method comprising:
generating an external clock on the integrated circuit, the external clock having a first programmable delay from the system clock;
generating a feedback clock on the integrated circuit, the feedback clock having a second programmable delay from the system clock;
providing the external clock to write data to the electronic component;
providing the feedback clock to read data from the electronic component;
determining a lowest passing value and a highest passing value based upon writing and reading data to and from the electronic component;
determining a bin based upon the lowest passing value and the highest passing value; and
programming the first programmable delay of the external clock with one of a plurality of predetermined delay values based on the bin, wherein the first programmable delay is equal to the second programmable delay plus an offset.

8. The method of claim 7 further comprising storing the predetermined delay values.

9. The method of claim 7 wherein the electronic component comprises at least one memory device.

10. The method of claim 9 wherein the electronic component comprises at least one of SDRAM, Burst NOR, Burst PSRAM, RAM, ROM, EPROM, EEPROM, or VRAM.

11. The method of claim 7 wherein the lowest passing value and the highest passing value are related to a range of speeds characterizing the integrated circuit and a range of speeds characterizing the electronic component.

12. The method of claim 7 wherein the electronic device comprises a wireless telephone, personal digital assistant, e-mail device, or Web enabled device.

13. An electronic device, comprising:
an electronic component; and an integrated circuit comprising:
means for generating a system clock:
means for generating an external clock on the integrated circuit, the external clock having a first programmable delay from the system clock;
means for generating a feedback clock on the integrated circuit, the feedback clock having a second programmable delay from the system clock;
means for providing the external clock to write data to the electronic component;
means for providing the feedback clock to read data from the electronic component;
means for determining a lowest passing value and a highest passing value based upon writing and reading data to and from the electronic component;
means for determining a bin based upon the lowest passing value and the highest passing value; and
means for programming the first programmable delay of the external clock with one of a plurality of predetermined delay values based on the bin, wherein the first programmable delay is equal to the second programmable delay plus an offset.

14. The electronic device of claim 13 further comprising means for storing the predetermined delay values.

15. The electronic device of claim 13 wherein the electronic component comprises at least one memory device.

16. The electronic device of claim 15 wherein the electronic component comprises at least one of SDRAM, Burst NOR, Burst PSRAM, RAM, ROM, EPROM, EEPROM, or VRAM.

17. The electronic device of claim 13 wherein the lowest passing value and the highest passing value are related to a range of speeds characterizing the integrated circuit and a range of speeds characterizing the electronic component.

18. The electronic device of claim 13 wherein the electronic device comprises a wireless telephone, personal digital assistant, e-mail device, or Web enabled device.

19. A non-transitory computer readable medium embodying instructions executable by a processor to perform a method of calibrating an integrated circuit to an electronic component, the integrated circuit including a system clock, an external clock having a first programmable delay from the system clock, and a feedback clock having a second programmable delay from the system clock, the external clock being provided to the electronic component to write data, and the feedback clock to read data from the electronic component, the instructions comprising:
- at least one instruction for causing the processor to determine a lowest passing value and a highest passing value based upon writing and reading data to and from the electronic component;
- at least one instruction for determining a bin based upon the lowest passing value and the highest passing value; and
- at least one instruction for causing the processor to program the first programmable delay of the external clock with one of a plurality of predetermined delay values based on the bin, wherein the first programmable delay is equal to the second programmable delay plus an offset.

* * * * *